United States Patent [19]

Markle

[11] Patent Number: 4,650,315
[45] Date of Patent: Mar. 17, 1987

[54] OPTICAL LITHOGRAPHIC SYSTEM

[75] Inventor: David A. Markle, Saratoga, Calif.

[73] Assignee: The Perkin-Elmer Corporation, Norwalk, Conn.

[21] Appl. No.: 732,593

[22] Filed: May 10, 1985

[51] Int. Cl.$^4$ .................. G03B 27/52; G03B 27/70
[52] U.S. Cl. .................................... 355/43; 350/442; 350/505; 355/51; 355/66
[58] Field of Search ............... 350/505, 442; 355/43, 355/51, 60, 65, 66

[56] References Cited

U.S. PATENT DOCUMENTS

| | | | |
|---|---|---|---|
| 3,951,546 | 4/1976 | Markle | 355/51 |
| 4,011,011 | 3/1977 | Hemstreet et al. | 355/51 X |
| 4,293,186 | 10/1981 | Offner | 350/505 |
| 4,294,538 | 10/1981 | Ban | 355/51 |
| 4,391,494 | 7/1983 | Hershel | 355/43 X |
| 4,422,754 | 12/1983 | Isohata et al. | 355/43 |

*Primary Examiner*—Richard A. Wintercorn
*Attorney, Agent, or Firm*—Thomas P. Murphy; Edwin T. Grimes; Francis L. Masselle

[57] ABSTRACT

The present invention is directed to an improvement in optical lithographic systems which includes in combination a ring field projection system and an optical condenser system for illuminating the ring field in the projection system, the condenser system being constructed and arranged to have lateral color of the right sign and magnitude to complement the radial variation in imagery with wavelength of the ring field projection system.

8 Claims, 3 Drawing Figures

OPTICAL LITHOGRAPHIC SYSTEM

FIELD OF INVENTION

This invention relates to optical lithographic systems and, more particularly, to such systems which are particularly adapted, among many other possible uses, for use in effecting the exposure of photoresist-coated semiconductor wafers in the manufacture of integrated circuits. This application is closely related to U.S. patent application Ser. No. 732,764 entitled "Ring Field Projection System" filed on even date herewith. Said application is assigned to the same assignee as the present application. The disclosure in said application is incorporated herein by reference.

BACKGROUND OF THE INVENTION

With many ring field projection systems, the zone of best correction changes with wavelength. One attempt to bring this problem within tolerable limits involved using a narrow slit that included only a portion of the optimum zone for each wavelength. Another attempt to control the problem involved limiting the bandwidth of the exposing radiation. Still another attempt to control the problem involved constraining the design to provide adequate correction at all wavelengths in a given zone. It is an object of the present invention to control this problem in a new and improved manner, as will become apparent as the description proceeds.

SUMMARY OF THE INVENTION

Briefly, the present invention is directed to a new and improved optical lithographic system, which comprises in combination a ring field projection system and an optical condenser system for illuminating the ring field in the projection system, the condenser system being constructed and arranged to have lateral color of the right sign and magnitude to complement the radial variation in imagery with wavelength of the ring field projection system. According to one aspect of the invention the ring field projection system is used in combination with a scanning system. According to another aspect of the invention the ring field projection system includes refractive material.

There has thus been outlined rather broadly the more important features of the invention in order that the detailed description thereof that follows may be better understood, and in order that the present contribution to the art may be better appreciated. There are, of course, additional features of the invention that will be described hereinafter which will form the subject of the claims appended thereto. Those skilled in the art will appreciate that the conception upon which the disclosure is based may readily be utilized as a basis for the designing of other systems for carrying out the several purposes of the invention. It is important, therefore, that the claims be regarded as including such equivalent systems as do not depart from the spirit and scope of the invention. Specific embodiments of the invention have been chosen for purposes of illustration and description, and are shown in the accompanying drawings, forming a part of the specification.

DETAILED DESCRIPTION OF THE INVENTION

Figure 1:
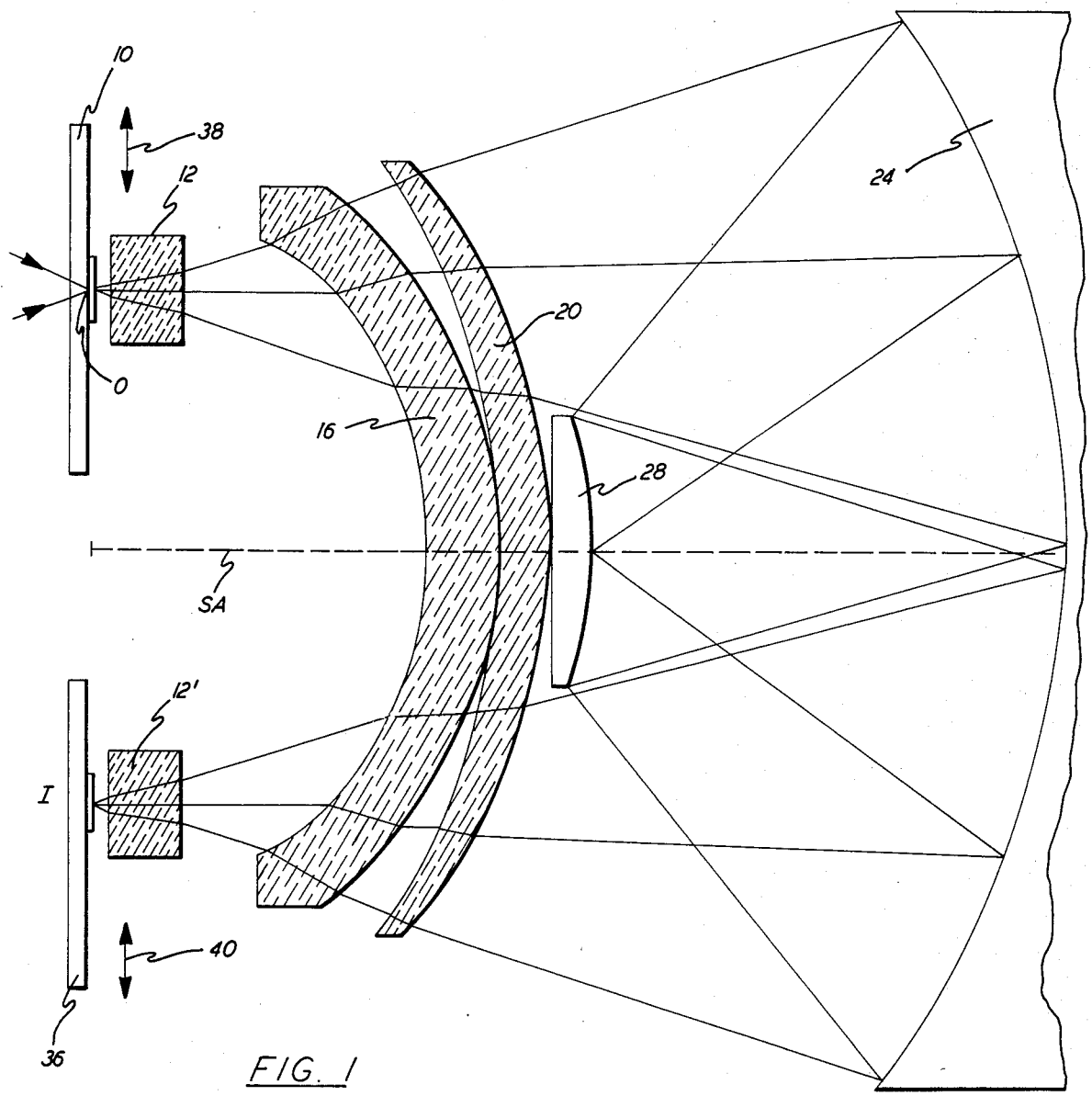
FIG. 1 is a schematic representation showing a ring field projection system, which could be used in the optical lithographic system of the present invention.

The present invention is directed to a new and improved optical lithographic system, which is characterized by a special combination of a ring field projection system and an optical condenser system for illuminating the ring field in the projection system. Any suitable ring field projection system may be employed such, for example, as the one shown in U.S. Pat. No. 4,293,186 issued Oct. 6, 1981. For purposes of explanation of the present invention, a good ring field projection system is shown in FIG. 1. This system includes an object plane where a mask 10 is mounted to receive a light image of a slit. Formation of the light image of the slit will be discussed more fully hereinafter. A thick, flat, parallel plate or window 12 is mounted closely adjacent the mask 10. This plate could be in the form of a beam splitter, if desired for alignment purposes. Spaced a distance from the thick plate 12 is first meniscus element 16. Disposed directly adjacent the first meniscus element 16 is a second meniscus element 20. Spaced from the two meniscus elements 16, 20 is a concave spherical mirror 24. A convex spherical mirror 28 is mounted directly adjacent the second meniscus element 20. The two spherical mirrors are arranged to provide three reflections within the system. The mirrors are arranged to have their centers of curvature nearly concentrically disposed along the system axis SA. The rays then return through the second meniscus element 20, the first meniscus element 16 and a second identical thick, flat plate 12' to an image plane I where a wafer 36 is mounted. It is noted that the meniscus elements 16, 20 serve to reduce the spherical aberration of the principal rays in the system. However, they introduce chromatic aberrations, which are substantially cancelled by the two thick, flat parallel plates 12 and 12'. The mask 10 and/or the wafer 36 is mounted for scanning movement, as schematically indicated by the arrows 38 and 40, respectively. This ring field projection system may be designed for use in a scanning mode or in a step and scan mode, as desired.

Figure 2:
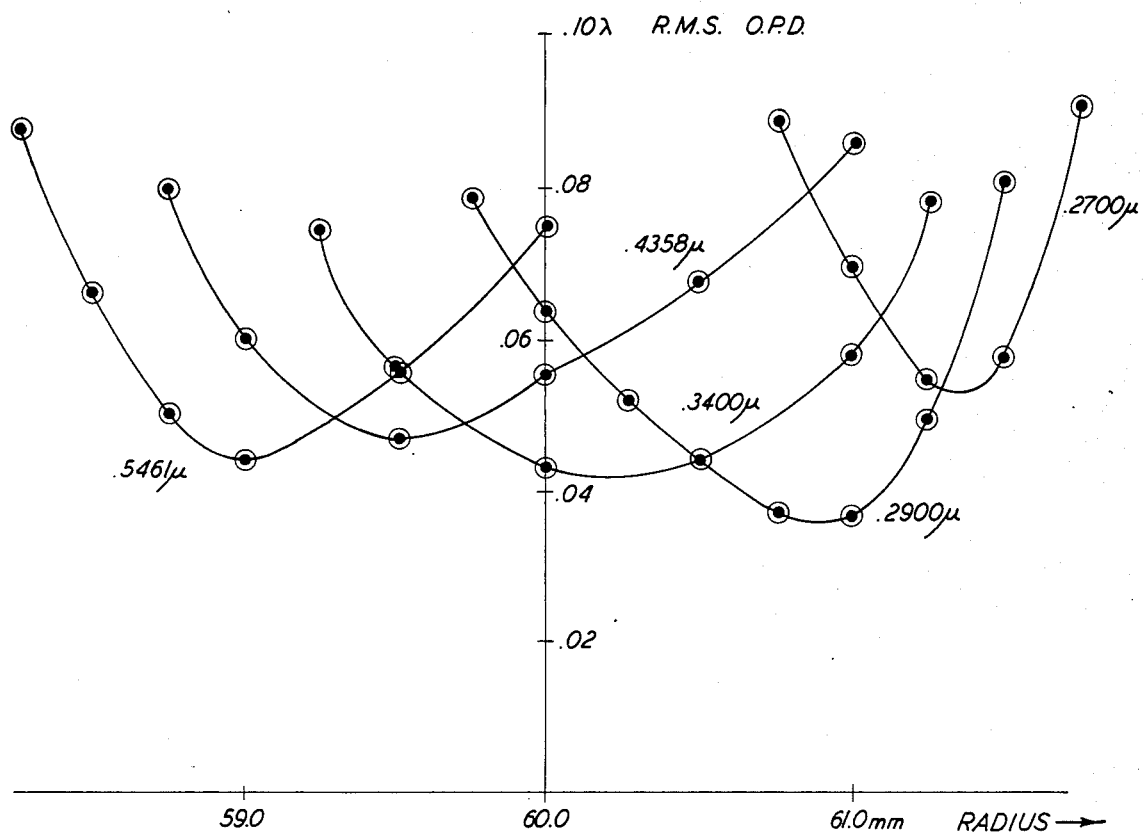
FIG. 2 is a graph showing image quality as a function of the radial distance from the optical axis for light at various wavelengths, using the ring field projection system of FIG. 1.

In spite of the fact that the ring field projection system of FIG. 1 is highly corrected by means of balancing one aberration against another, particularly over the region of the slit, the imagery is better at one place at one wavelength and better at another place at another wavelength. That is, if the projection system of FIG. 1 is considered in isolation, there is still a variation in imagery with wavelength over any part of the field. FIG. 2 shows a series of curves plotting the optimum radial zone of the slit for imaging by the projection system of FIG. 1 at various wavelengths. The abscissa is the radial distance from the optical axis in millimeters, and the ordinate r.m.s.O.P.D. is a measure of image quality. As seen in FIG. 2, the optical correction for the design shown in FIG. 1 is best in a radial zone between 59 and 60.25 millimeters from the optical axis for light with a 0.4358 micron wavelength. This zone changes to a zone of from 59.45 to 61 millimeters for light with a 0.3400 micron wavelength.

Figure 3:
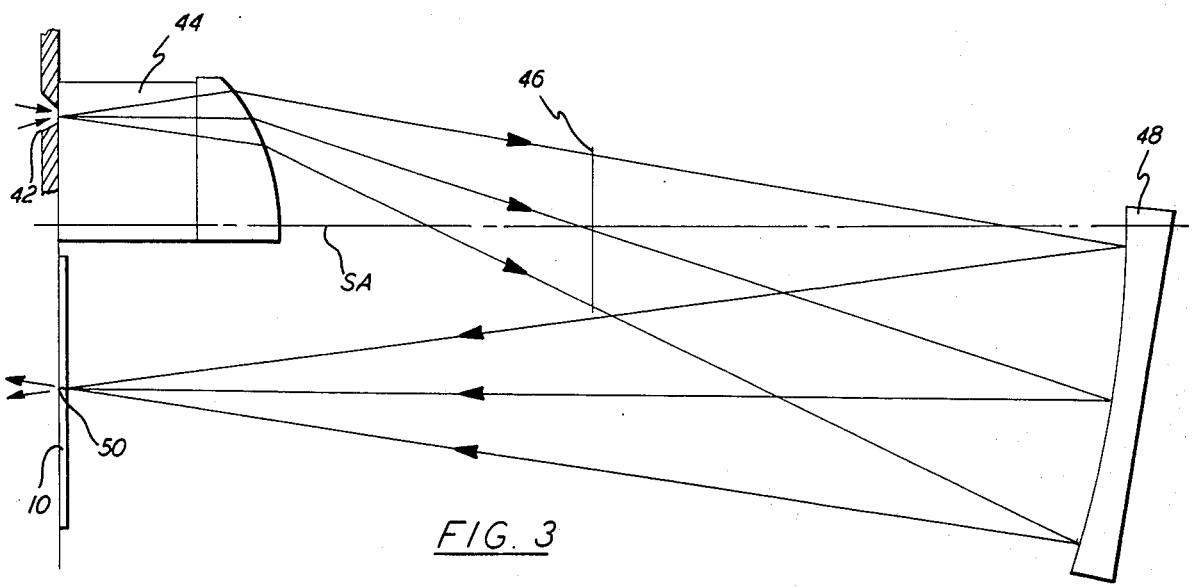
FIG. 3 is a schematic representation showing a ring field optical condenser system relay for illuminating the ring field in the projection system of FIG. 1.

According to the present invention, compensation is made completely outside the ring field projection system to compensate or complement the properties of the projection system. That is, by adding an optical condenser or illuminator that has lateral color of the right sign and magnitude between the slit and its image on the object plane of the projection system it is possible to utilize the entire spectral range from about 2800 angstroms to about 5800 angstroms without appreciable loss of resolution, because the condenser relay images the slit at the optimum radial position for imaging by the projection system. There are countless ways of introducing lateral color of the right sign and magnitude. One possibility is the optical condenser relay system shown in FIG. 3, which is particularly compatible with the projection system of FIG. 1. The relay of FIG. 3 is a modified or half-Dyson system. A narrow slit 42 defines the width of the well corrected annulus in the projection system. A thick lens 44 is provided, which is an element that introduces a lateral color component because it is a refractive component. It directs the chief ray past a stop or pupil 46, through the focus of a spherical mirror 48 so that after being reflected from the mirror the chief rays are once again telecentric. The illuminated image of the slit is imaged at 50 on the mask plane 10 of the projection system of FIG. 1. The radial position 50, with respect to the system axis SA, of the slit image varies with wavelength. The lateral color comes from the lens 44 and the mirror 48 simply functions as a one-to-one relay that reimages the virtual image of the slit where it is wanted on the mask. The magnification is obtained as a function of the index of the glass of the thick lens 44. In other words the lens 44 and the spherical mirror 48 produce a magnified image of the narrow slit on the object plane 10 of the projection system. The radial position of the slit image 50 varies with wavelength because the lateral magnification of this relay varies with wavelength, a condition known as lateral color. For example, a chief ray starting at 40.62 millimeters from the optical axis SA in the slit plane 42 will be imaged at the mask plane 10 at 60.59 millimeters at 0.290 microns wavelength, and at 60.00 millimeters at 0.350 microns wavelength, and at 59.32 millimeters at 0.5461 microns wavelength. This is just about the right variation to suit the different positions of optimum imagery shown in FIG. 2.

It will thus be seen that the present invention does indeed provide a new and improved optical lithographic system which, by using a condenser having a lateral color of the right sign and magnitude, makes it possible to take full advantage of a ring field projection system in which the zone of optimum correction varies with wavelength.

Although specific embodiments have been illustrated and described, it will be obvious to those skilled in the art that various modifications may be made without departing from the spirit and scope of the invention, which is to be limited solely by the appended claims.

What is claimed is:

1. An optical lithographic system comprising, in combination:
   a ring field projection system containing one or more refractive components;
   an optical condenser system for illuminating the ring field in the projection system;
   said optical condenser system being constructed and arranged to have lateral color of the right sign and magnitude to complement the radial variation in imagery with wavelength of the ring field projection system.

2. An optical lithographic system according to claim 1 wherein said ring field projection system includes at least one convex and one concave mirror, said mirrors being nearly concentrically arranged along an optical axis, and refracting means.

3. An optical lithographic system according to claim 1 wherein said ring field projection system is a one-to-one system.

4. An optical lithographic system according to claim 1 wherein said optical condenser system is a ring field illumination system.

5. An optical lithographic system according to claim 4 wherein said ring field illumination system includes a thick lens and a spherical mirror.

6. An optical lithographic system comprising, in combination:
   a ring field projection system containing one or more refractive components;
   an optical condenser system for projecting a light image of a slit in the ring field in the projection system;
   said ring field projection system including means for defining an object plane where a mask is mountable and means for defining an image plane for receiving a real image of an object in the object plane and where a wafer is mountable, said object plane being disposed to receive said light image of the slit;
   said optical condenser system being constructed and arranged so that the radial position of the slit image in the object plane varies to complement the radial variation in imagery with wavelength of the ring field projection system.

7. An optical lithographic system according to claim 6 wherein the mask and/or the wafer is mounted for scanning movement.

8. An optical lithographic system according to claim 7 wherein said ring field projection system includes at least one convex and one concave spherical mirror, said mirrors having their centers of curvature disposed along an optical axis, and refracting means.

* * * * *